US012732209B2

(12) United States Patent
Shen et al.

(10) Patent No.: US 12,732,209 B2
(45) Date of Patent: Sep. 8, 2026

(54) EFFICIENT DATA COMPRESSION IN PROCESSING SYSTEMS

(71) Applicant: QUALCOMM Incorporated, San Diego, CA (US)

(72) Inventors: Jian Shen, San Diego, CA (US); Jamie Menjay Lin, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 162 days.

(21) Appl. No.: 18/827,322

(22) Filed: Sep. 6, 2024

(65) Prior Publication Data

US 2026/0074713 A1 Mar. 12, 2026

(51) Int. Cl.
*H03M 7/30* (2006.01)
*G06F 5/01* (2006.01)
*G06F 7/50* (2006.01)

(52) U.S. Cl.
CPC ............ *H03M 7/3062* (2013.01); *G06F 5/01* (2013.01); *G06F 7/50* (2013.01); *H03M 7/3066* (2013.01); *H03M 7/6005* (2013.01); *H03M 7/6011* (2013.01)

(58) Field of Classification Search
CPC ............. H03M 7/3062; H03M 7/6005; H03M 7/6011; H03M 7/3066; G06F 5/01; G06F 7/50
USPC ................................................ 341/50–51, 87
See application file for complete search history.

(56) References Cited

U.S. PATENT DOCUMENTS 11,757,469 B2 9/2023 Kulkarni et al.
11,863,208 B2 * 1/2024 Fenney ................... H03M 7/40
2019/0087713 A1 * 3/2019 Lamb ................... G06N 3/0495

OTHER PUBLICATIONS

"Information technology—Multimedia content description interface—Part 17: Compression of Neural Networks for Multimedia Content Description and Analysis", ISO/IEC 15938-172024, IEC, 3, Rue De Varembe, Po Box 131, CH-1211 Geneva 20, Switzerland, Jan. 10, 2024, 104 Pages, XP082079537.
International Search Report and Written Opinion—PCT/US2025/044230—ISA/EPO—Jan. 5, 2026.
Kim J., et al., "TruncQuant: Truncation-Ready Quantization for DNNs with Flexible Weight Bit Precision", Jun. 13, 2025, 7 Pages, XP093343032.
Li S., et al., "SWIS—Shared Weight blt Sparsity for Efficient Neural Network Acceleration", arxivorg, Mar. 3, 2021, 8 Pages, XP081904072, abstract pp. 3,5 figures 4,5.
Qualcomm: "Qualcomm Hexagon V69 HVX Programmer's Reference Manual", Qualcomm technologies, HVX Instruction Set, 80-N2040-49 Rev. AA, Jan. 11, 2022, pp. 1-297.

* cited by examiner

*Primary Examiner* — Khai M Nguyen
(74) *Attorney, Agent, or Firm* — Patterson + Sheridan LLP

(57) ABSTRACT

Certain aspects of the present disclosure provide techniques and apparatus for efficiently performing operations using data compression. An example method generally includes identifying, for a block of data samples, a number of leading bits to remove from each data sample in the block of data samples. A block of compressed data samples is generated based on the identified number of leading bits and truncation of a number of least significant bits from each data sample in the block of data samples. A bitstream including the block of compressed data samples and an indication of a type of compression applied to the block of data samples is generated and output for further processing.

15 Claims, 5 Drawing Sheets

EFFICIENT DATA COMPRESSION IN PROCESSING SYSTEMS

INTRODUCTION

Aspects of the present disclosure relate to efficient processing of compressed data in processing systems.

Executing various operations in processing systems, such as those involved in training and inferencing using machine learning models, involve the execution of various mathematical operations are performed using various mathematical processing components. For example, multiply-and-accumulate (MAC) units may be used to perform these operations to train a model and perform inferences on input data using the trained model. These mathematical operations may be performed on various types of numerical data with varying complexity. Generally, the complexity of these operations may scale with the bit size of the data and the type of the data. For example, operations using 8-bit integers may be less computationally complex than performing an inference using larger sized integers, such as 64-bit integers. Similarly, operations using a given bit size of integers may be less computationally complex than operations using the given bit size of floating-point numbers (e.g., operations performed using 32-bit integers may be less computationally complex than operations using 32-bit floating-point numbers, even though the data is the same size in bits).

Power utilization, thermal output, and processing time generally scale with computational complexity. That is, less computationally complex operations generally consume less power, generate less heat, and are completed more quickly than more computationally complex operations. Consequently, the execution of more computationally complex operations may result in reduced battery life and delays in the ability to reassign computing resources (e.g., compute cores on a processor, memory, etc.) to other tasks executing on a device.

BRIEF SUMMARY

Certain aspects provide a processor-implemented method for efficiently performing operations using data compression (e.g., in a computer processor or other processing system, such as a central processing unit, a graphics processing unit, a neural processing unit, an application-specific integrated circuit, or the like). The method generally includes identifying, for a block of data samples, a number of leading bits to remove from each data sample in the block of data samples. A block of compressed data samples is generated based on the identified number of leading bits and truncation of a number of least significant bits from each data sample in the block of data samples. A bitstream including the block of compressed data samples and an indication of a type of compression applied to the block of data samples is generated and output for further processing.

Certain aspects provide an arithmetic shifter for efficient data compression in a processing system. The arithmetic shifter generally includes an arithmetic right shifter configured to shift a value in an input register by a number of bits; a multiplexer configured to output a carry bit from the number of bits based on a selector signal identifying that a compression operation is being executed; and an adder configured to add the shifted value generated by the arithmetic right shifter to an output of the multiplexer.

Other aspects provide processing systems configured to perform the aforementioned methods as well as those described herein; non-transitory, computer-readable media comprising instructions that, when executed by one or more processors of a processing system, cause the processing system to perform the aforementioned methods as well as those described herein; a computer program product embodied on a computer-readable storage medium comprising code for performing the aforementioned methods as well as those further described herein; and a processing system comprising means for performing the aforementioned methods as well as those further described herein.

The following description and the related drawings set forth in detail certain illustrative features of one or more aspects.

BRIEF DESCRIPTION OF THE DRAWINGS

The appended figures depict example features of certain aspects of the present disclosure and are therefore not to be considered limiting of the scope of this disclosure.

To facilitate understanding, identical reference numerals have been used, where possible, to designate identical elements that are common to the drawings. It is contemplated that elements and features of one aspect may be beneficially incorporated in other aspects without further recitation.

DETAILED DESCRIPTION

Figure 1:
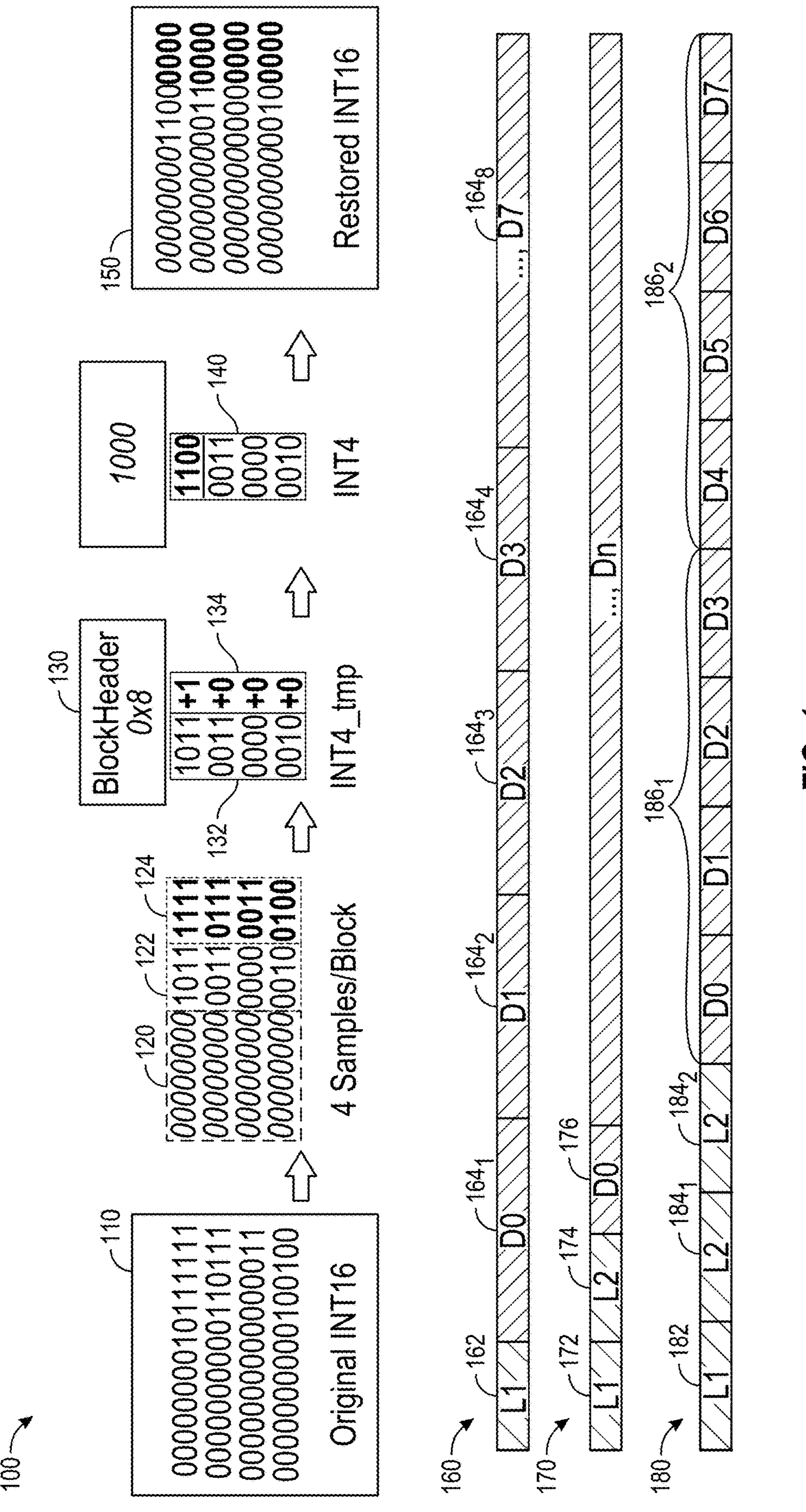
FIG. 1 illustrates an example of efficient vector data compression which may be performed by a processing system, according to certain aspects of the present disclosure.

Certain aspects of the present disclosure provide apparatuses, methods, processing systems, and non-transitory computer-readable mediums for efficiently performing operations in a processing system using vector data compression.

Processing systems configured to perform data-intensive tasks, such as training and inferencing using neural networks, may use vector processing techniques for such tasks. These vector processing techniques generally allow for multiple data elements arranged in a one-dimensional array (referred to as a vector) to be processed in parallel or substantially in parallel by storing multiple words of a defined length in a vector register and executing operations (e.g., implemented using a vector instruction set that allows for such parallel processing of data in a vector) on a per-word basis using dedicated hardware for each word. For example, a vector register may be a 1024-bit register that supports the storage and processing of (1) 32 elements with a length of 32 bits per element; (2) 64 elements with a length of 16 bits per element; or (3) 128 elements with a length of 8 bits per element.

To reduce the computational cost of processing vector data in a processing system, various schemes may be used to compress the data prior to processing. For example, for machine learning model tensor data (e.g., weights, parameters, etc.) stored in one or more vector registers and processed by the processing system using vector processing techniques, tensor data may be organized and compressed on a per-layer basis, a per-group basis, a per-channel basis, or the like. Regardless of the granularity in which data is considered for compression, outlier values may have a significant impact on the ability to represent data using a given bit width, such as a four-bit integer (INT4) or an eight-bit integer (INT8). Further, within a granularity, different blocks of data may have different dynamic ranges, and thus, the use of a single quantization technique across different blocks of data may not efficiently compress the data in these blocks.

Certain aspects of the present disclosure provide techniques for efficiently performing operations based on compressed vector data in a processing system. As discussed in further detail herein, to allow for flexible compression of vector data in a processing system, certain aspects of the present disclosure may be compressed in a hierarchical manner, with a hierarchical header of a bitstream specifying a level of compression to apply to different blocks of compressed data in a bitstream. This level of compression generally indicates a number of leading zero bits that are removed from one or more blocks of data to which compression is applied. To further compress vector data in the block of data, a number of least significant bits may be truncated so that the resulting data is compressed into a number of bits commensurate with a desired bit width for use in storing data for efficient processing by the processing system, with the last bit serving as a carry bit added to the resulting compressed data to preserve at least some of the truncated data in the compression process. By doing so, aspects of the present disclosure may allow for increased compression efficiency, as outliers in a data set may affect the manner by which a block of data, or portion of data, in a data set, but not the entire data set, is compressed. In turn, such blockwise data compression techniques as discussed herein may reduce the computational complexity of processing compressed data in a processing system, which may allow for the utilization of fewer compute resources to complete various tasks for which vector data is used, such as machine-learning-model-based operations. In turn, the techniques discussed herein may reduce the amount of power used by computing devices to perform these tasks and/or accelerate processing of large data inputs, relative to the amount of power and/or time used when blockwise vector data compression is not used to compress vector data in a processing system.

Example Hierarchical Blockwise Vector Data Compression in Processors

FIG. 1 illustrates an example 100 of efficient hierarchical blockwise vector data compression which may be performed by a processing system, according to certain aspects of the present disclosure As illustrated, an original data block 110 may include a plurality of data elements which may be compressed, at some point, using the techniques discussed herein. While FIG. 1 illustrates the data elements as sixteen-bit integers, it should be recognized that the data elements subject to compression within the original data block 110 may be of any size.

To compress the data in the original data block 110, a block 120 of leading bits may be identified across the data elements in the original data block 110. The block 120 of leading bits may be bits with values of 0. The number of bits included in the block of leading bits may be the smallest number of leading zero-value bits (i.e., the most significant bits with a zero value) that are common across the different data elements in the original data block 110. In the example illustrated in FIG. 1, it may be seen that the smallest number of leading zero-value bits that are common across the different data elements in the original data block 110 is eight, as the ninth bit in the first data element in the original data block 110 is 1 and thus cannot be removed from a data element without losing significant amounts of information. Based on the identification of these eight bits as the number of leading bits which can be removed from each of the data elements in the original data block 110, the block 120 of leading bits may be removed, and the number of bits may be preserved in a block header 130 for inclusion in a bitstream representing the original data block 110.

The remaining eight bits after the block 120 of leading bits are removed from the data samples may include the most significant bits 122 and the least significant bits 124. The most significant bits 122 may be transferred as the most significant bits 132. Meanwhile, the least significant bits 124 may be reduced to a set of carry bits 134, based on the value of the most significant bits of the least significant bits 124 for each data element in the original data block 110. The most significant bits 132 and the carry bits 134 may be added together, resulting in the compressed values 140 for the original data block 110.

To decompress the compressed values 140 and recover an approximation 150 of the original data block 110, the header 130 may be used to identify a number of leading bits to add to the compressed values 140. After the leading bits are added to the compressed values 140 in the most significant bit positions (e.g., to the left of the most significant bit in the compressed values 140 for a big-endian system), least significant bits (e.g., having values of 0) may be appended to recover a 16-bit representation of the data elements in the original data block 110.

In the example 100 illustrated in FIG. 1, the carry bits 134 for the data elements in the original data block 110 may be 1, 0, 0, and 0, respectively (from the top to bottom). The carry bits 134 may be added to the most significant bits 132, which may leave the second through fourth elements unchanged (because the carry bits for those samples are 0). The value of the first data element may be changed from 1011 to 1100 as a result of adding the carry bit of 1 to the most significant bits 132 of the first data sample.

In some aspects, though not illustrated in FIG. 1, a decision to add or not add the carry bit may be made based on the most significant bit of the most significant bits 132. For example, when the most significant bit of the most significant bits 132 for a data element is 1, there is no leading zero bit. Based on determining that the most significant bit of the most significant bits 132 for a data element is 1, the addition of a carry bit may be omitted to prevent an overflow situation from causing a loss of data due to the addition of the carry bits 134 to the most significant bits 132.

To encode the compressed values 140 for storage and transmission, various bitstream options may be used including a level 1 (L1) header and one or more level 2 (L2) headers. The bitstream 160 illustrates an example in which no compression is applied to the data elements in a vector register. In the bitstream 160, the L1 header 162 may be a bit pattern that indicates that no compression has been applied to any of the data elements in a vector register. Subsequently, the values $\mathbf{164}_1$ through $\mathbf{164}_8$ of the data in the data register may be appended sequentially to form the bitstream 160.

Thus, for a 1024-bit vector register, the bitstream 160 may have a size that is the sum of the number of bits used for the L1 header and 1024 bits.

The bitstream 170 illustrates an example in which the same amount of compression is applied to the data elements in a vector register. In the bitstream 170, thus, a hierarchical header may be used to indicate (1) that compression has been applied to the data elements in the vector register and (2) the amount of compression applied to the data elements in the vector register, in terms of the number of leading zeros identified in the header 130. The bitstream 170 includes a L1 header 172 which encodes, via a defined bitstream, an indication that uniform amounts of compression have been applied to the data elements in the vector register (e.g., that the compression identified in the L2 header 174 is repeated for each data element in the vector register), and an L2 header 174 encoding the information about the number of leading zeros removed from the data elements in the vector register (e.g., as reflected in the header 130). Finally, the compressed values 176 of each of the data elements in the vector register (corresponding to the compressed values 140 described above) may be sequentially added to the bitstream 170. The size of the bitstream 170 may thus be the number of bits into which each data element is compressed, multiplied by the number of data elements in the vector register, plus the size of the L1 header 172 and the L2 header 174. In the example illustrated with respect to the compression of the original data block 110 into the compressed values 140, thus, the bitstream may be reduced from 64 bits (representing four sixteen-bit integers) to 16 bits (representing four four-bit integers), plus the number of bits used to implement the L1 header 172 and the L2 header 174.

In some aspects, as illustrated by the bitstream 180, different amounts of compression may be applied to different blocks of data elements in a vector register. To reflect a blockwise compression technique, the bitstream 180 may include a L1 header 182 and a plurality of L2 headers 184 (e.g., L2 headers $\mathbf{184}_1$ and $\mathbf{184}_2$, amongst others not illustrated in FIG. 1). The L1 header 182 may be a bitstream indicating that an amount of compression is specified for each of a plurality of blocks of data elements in the vector register. In some aspects, different values of the bitstream may indicate the number of data elements included in each block of data elements $\mathbf{186}_1$, $\mathbf{186}_2$ (amongst others, not illustrated in FIG. 1). The L2 headers 184 may correspond to the data elements 186 and indicate the number of leading zeros removed from the original values of the data elements in a given block. For example, the L2 header $\mathbf{184}_1$ may indicate the number of leading zeros removed from the original values of the data elements in the block of data elements $\mathbf{186}_1$, while the L2 header $\mathbf{184}_2$ may indicate the number of leading zeros removed from the original values of the data elements in the block of data elements $\mathbf{186}_2$. By specifying a level of compression on a blockwise level, the techniques illustrated in the bitstream 180 may allow for different levels of compression to be applied to different blocks of data so that outlier values may affect fewer data elements than if a uniform level of compression were applied across all of the data elements in a vector register.

Figure 2:
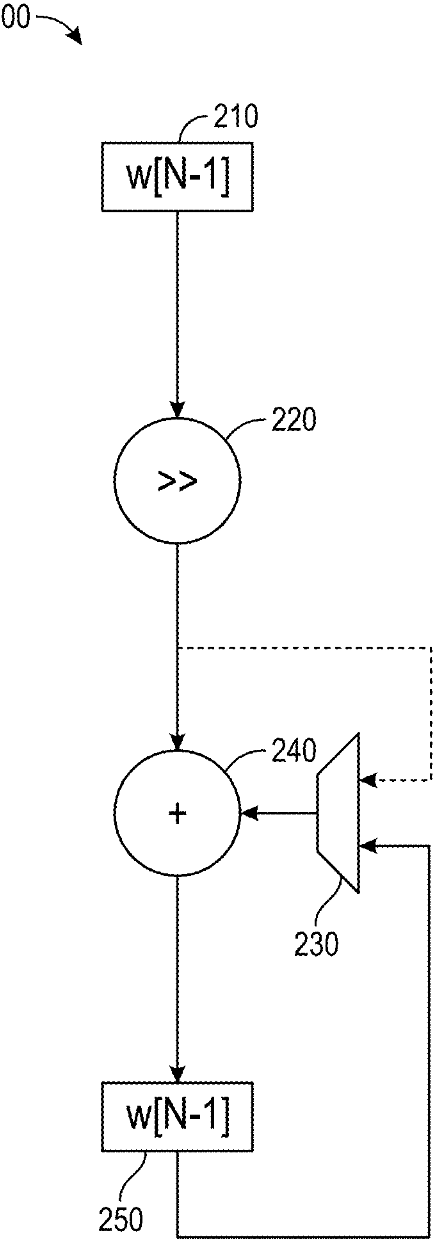
FIG. 2 illustrates an example arithmetic shifter for efficiently compressing vector data in a processing system, according to certain aspects of the present disclosure.

FIG. 2 illustrates an arithmetic shifter 200 that allows for efficient compression of vector data in a processing system, according to certain aspects of the present disclosure. While the arithmetic shifter 200 is illustrated for a single data element in a vector register, it should be understood that a processing system may include arithmetic shifters 200 for each data element in a vector register to allow for parallel compression of the data elements in the vector register.

As illustrated, an input register 210 may include a data element (e.g., a 32-bit word, a 16-bit half-word, an 8-bit byte, etc.) which is to be compressed using the techniques discussed herein. After the leading zeros are identified and removed from the data element stored in the input register 210, the value in the input register may be input into an arithmetic right shifter 220 which shifts the value in the input register 210 rightwards by a specified number of bits. The bits discarded by the arithmetic right shifter 220 may be input into a multiplexer 230 for selection as a signal to be output to the adder 240. The multiplexer 230 may, as illustrated, be a two-to-one multiplexer with inputs corresponding to the value in the output register 250 and a carry bit from the arithmetic right shift applied by the arithmetic right shifter 220 and a selector input (not illustrated) indicating whether the carry bit or the value of the output register 250 should be added to the output of the arithmetic right shifter 220. Generally, the selector input may indicate that the carry bit is to be input into the adder 240 when a compression operation is being executed.

The adder 240 adds the output of the arithmetic right shifter and the value selected by the multiplexer 230. The output of the adder 240 may be stored in the output register 250 (which, in some aspects, may be same register as the input register 210). Generally, the data stored in the output register 250 may be of a smaller bit width than the data stored in the input register 210. After the data in the input register 210 is compressed, the input register 210 (if different from the output register 250) may be discarded. In some aspects, discarding the data in the input register 210 may include allowing the values in the input register 210 to be overwritten with new data.

Generally, operations performed by the arithmetic shifter 200 may be an atomic operation executable by invoking a single instruction on a processing system implementing the arithmetic shifter 200. For example, the single instruction may be a vector add and shift instruction that instructs the processor to use the arithmetic shifter to (1) perform a right shift on data in a vector register and (2) add a carry bit to the right-shifted data, where the carry bit corresponds to the last bit shifted rightwards for each data element in the vector register.

Figure 3:
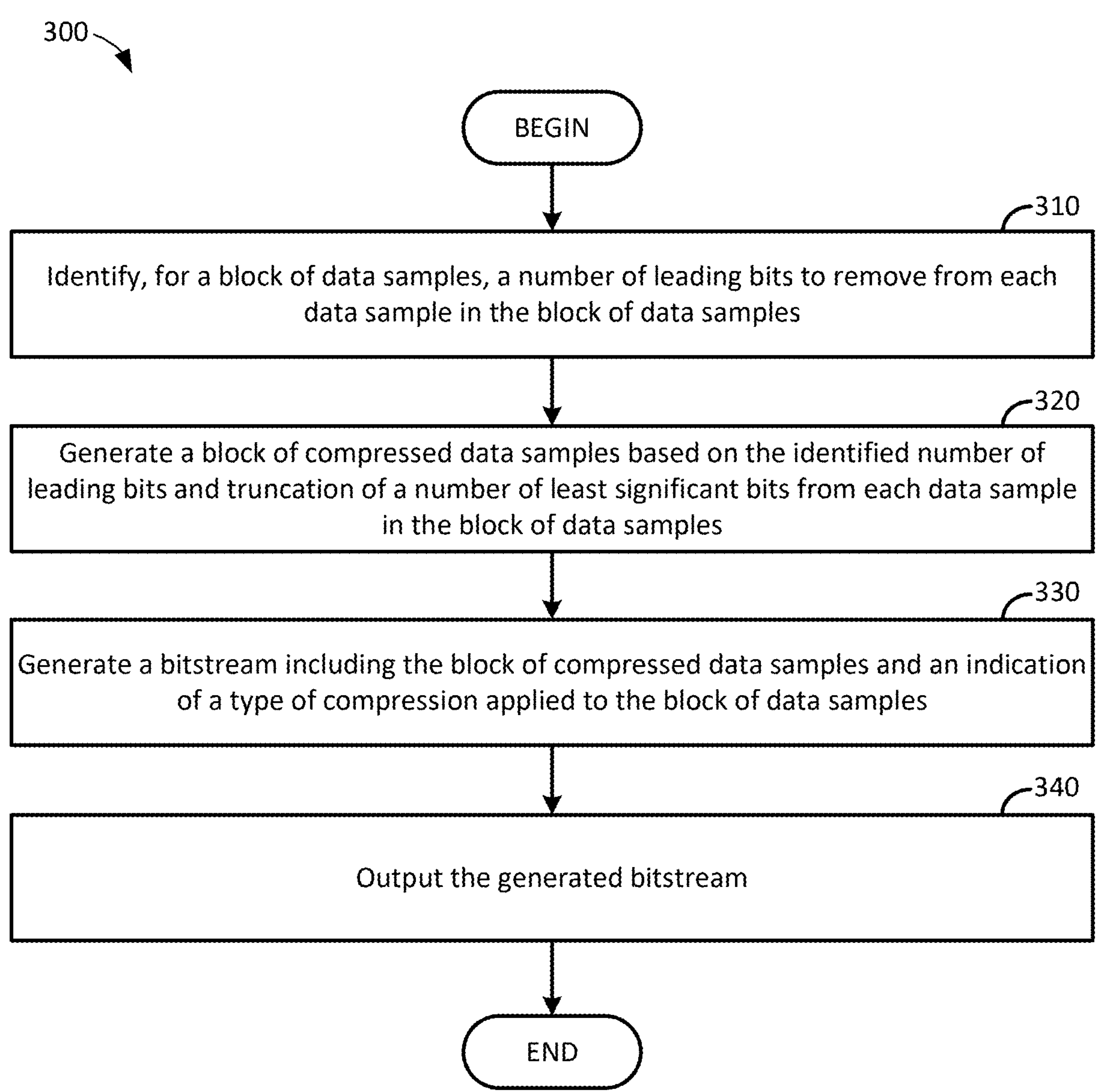
FIG. 3 illustrates example operations for efficiently performing operations using vector data compression in a processing system, according to certain aspects of the present disclosure.

Example Operations for Efficient Vector Data Compression and Decompression Based on Hierarchical Blockwise Compression FIG. 3 illustrates example operations 300 for efficiently performing operations using vector data compression in a hierarchical blockwise manner using a processor (e.g., a computer processor), according to certain aspects of the present disclosure. The operations 300 may be performed, for example, by a computing system on which vector data compression may be performed via an arithmetic shifter (e.g., as illustrated above with respect to FIG. 2), such as a user equipment (UE), a smartphone, a tablet computer, an autonomous vehicle, an edge device, or other computing system (e.g., such as the processing system 500 illustrated in FIG. 5 and described in further detail below).

As illustrated, the operations 300 begin at block 310, with identifying, for a block of data samples, a number of leading bits to remove from each data sample in the block of data samples.

At block 320, the operations 300 proceed with generating a block of compressed data samples based on the identified number of leading bits and truncation of a number of least significant bits from each data sample in the block of data samples.

In some aspects, the block of compressed data samples may be generated via an arithmetic shifter supporting addition of a carry bit to the shifted data. For each respective data sample in the block of data samples, a right shift may be applied to the respective data sample according to the number of least significant bits identified for truncation. The most significant bit of the least significant bits identified for truncation may be designated as a carry bit. The carry bit may be added to the right-shifted respective data sample.

At block 330, the operations 300 proceed with generating a bitstream including the block of compressed data samples and an indication of a type of compression applied to the block of data samples. In some aspects, the indication of the type of compression applied to the block of data samples may be a hierarchical indication including a L1 header and one or more L2 headers.

At block 340, the operations 300 proceed with outputting the generated bitstream. In some aspects, outputting the generated bitstream may include storing the generated bitstream in one or more vector registers in a processor, in random access memory, in persistent memory accessible by the processor, or outputting the bitstream for transmission (e.g., via a network interface) to another computing system.

In some aspects, the indication of the type of compression applied to the block of data samples comprises a first header (e.g., an L1 header illustrated in FIG. 1) and a second header (e.g., an L2 header illustrated in FIG. 1). The first header generally indicates whether the bitstream includes compressed data. The second header generally indicates the number of leading bits removed from each data sample in the block of compressed data samples. Generally, the second header being located subsequent to the first header in the generated bitstream.

In some aspects, the operations 300 may further include decompressing the generated bitstream in order to recover an approximation of the block of data samples. To do so, the generated bitstream may be received. For each respective compressed data sample in the block of compressed data samples in the received bitstream, the number of leading bits indicated in the second header may be added as most significant bits to the respective compressed data sample. The number of truncated least significant bits may be added to the respective compressed data sample. Generally, the number of truncated least significant bits may be inferred from the size of the compressed data sample and the number of leading bits identified in the second header based on the number of data samples included in the received bitstream. For example, based on an assumption that a vector register may store data in the same bit width, the number of data samples included in the received bitstream may indicate the bit width to which each data sample is to be restored. For a 1024-bit vector register, for example, the inclusion of 32 data samples may indicate that each compressed data sample in the block is to be decompressed into a 32-bit word. Thus, the number of least significant bits to add to a data sample may be calculated as 32, less the number of leading bits indicated in the second header, less the width of the compressed data sample.

In some aspects, the indication of the type of compression applied to the block of data samples comprises a first header and a plurality of second headers. Generally, the first header (e.g., the L1 header illustrated in FIG. 1) indicates whether the bitstream includes compressed data. Each second header of the plurality of second headers (e.g., the L2 headers illustrated in FIG. 1) identifies the number of leading bits removed from each data sample in a corresponding block of compressed data samples. In some aspects, the first header may have a bitstream with a reserved value indicating (1) that the bitstream includes compressed data and (2) the number of data elements to which each second header applies.

In some aspects, the operations 300 may further include decompressing the generated bitstream on a blockwise basis in order to recover an approximation of the block of data samples. To do so, the generated bitstream may be received. For each respective compressed data sample in the block of compressed data samples, the number of leading bits identified in a corresponding second header may be added as most significant bits to the respective compressed data sample. The block of data samples may be reconstructed based on the block of compressed data samples and the indicated type of compression applied to the plurality of data samples.

Figure 4:
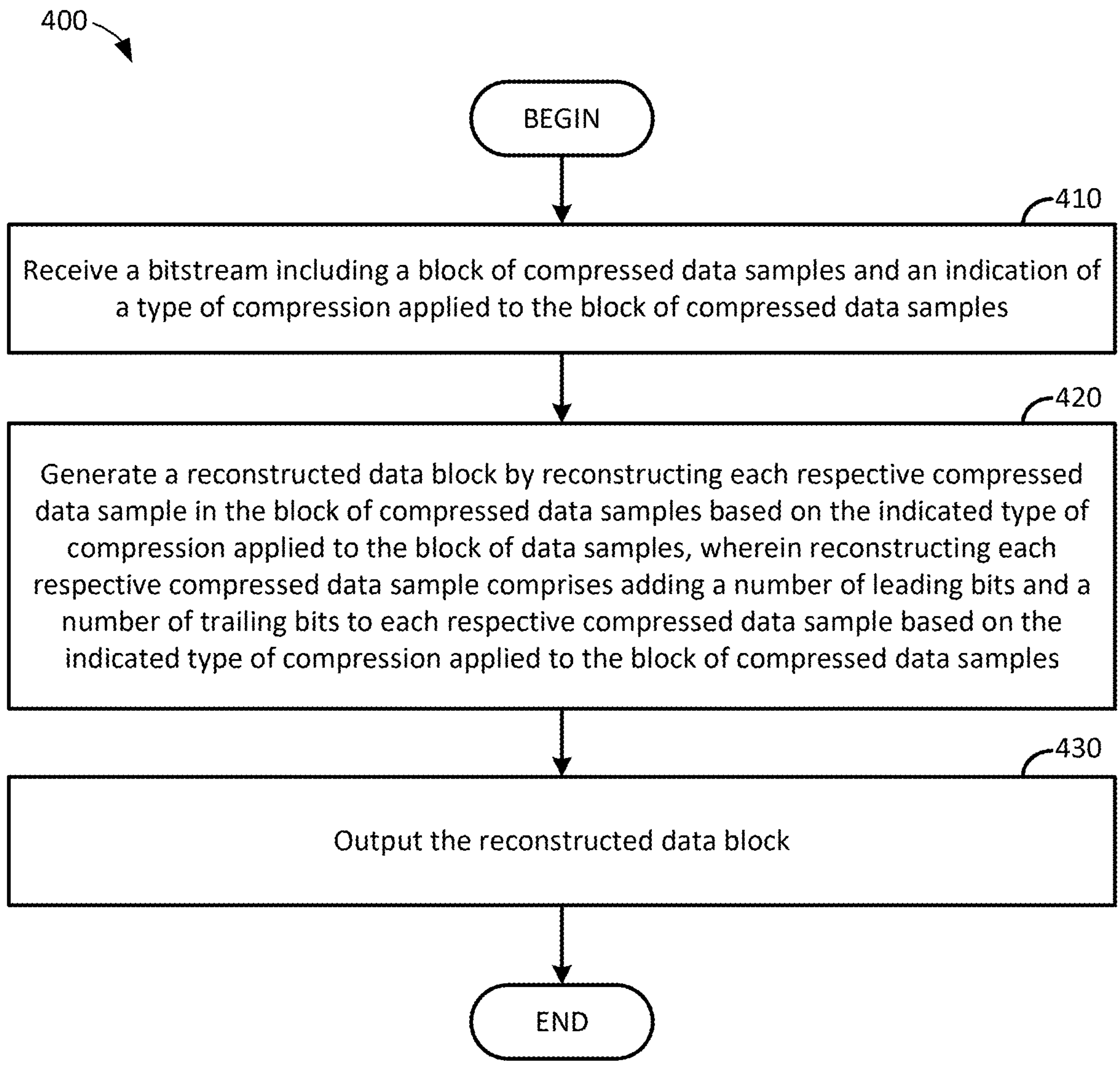
FIG. 4 illustrates example operations for efficiently decompressing vector data in a processing system, according to certain aspects of the present disclosure.

FIG. 4 illustrates example operations 400 for efficiently decompressing vector data in a processing system, according to certain aspects of the present disclosure. The operations 400 may be performed, for example, by a computing system on which vector data compression and decompression may be performed via an arithmetic shifter (e.g., as illustrated above with respect to FIG. 2), such as a user equipment (UE), a smartphone, a tablet computer, an autonomous vehicle, an edge device, or other computing system (e.g., such as the processing system 500 illustrated in FIG. 5 and described in further detail below).

As illustrated, the operations 400 begin at block 410, with receiving a bitstream including a block of compressed data samples and an indication of a type of compression applied to the block of compressed data samples.

At block 420, the operations 400 proceed with generating a reconstructed block by reconstructing each respective compressed data sample in the block of compressed data samples based on the indicated type of compression applied to the block of compressed data samples. Generally, reconstructing teach respective compressed data sample includes adding a number of leading bits and a number of trailing bits to each respective compressed data sample based on the indicated type of compression applied to the block of compressed data samples.

At block 430, the operations 400 proceed with outputting the reconstructed data block.

In some aspects, the indication of the type of compression applied to the block of data samples comprises a first header (e.g., the L1 header illustrated in FIG. 1) indicating whether the bitstream includes compressed data and a second header (e.g., the L2 headers illustrated in FIG. 1) indicating the number of leading bits removed from each data sample in the block of compressed data samples, the second header being located subsequent to the first header in the received bitstream. In some aspects, the second header comprises a single field indicating the number of leading bits to add to each compressed data sample in the block of compressed data samples. In some aspects, generating the reconstructed data block comprises, for each respective compressed data sample, adding the number of leading bits as most significant bits to the respective compressed data sample and adding the number of trailing bits as least significant bits to the respective compressed data sample.

In some aspects, the indication of the type of compression applied to the block of data samples comprises a first header indicating whether the bitstream includes compressed data and a plurality of second headers, and wherein each second header of the plurality of second headers identifies the number of leading bits removed from each data sample in a corresponding block of compressed data samples. In some aspects, generating the reconstructed data block comprises, for each respective compressed data sample, adding the number of leading bits identified in a corresponding second header as most significant bits to the respective compressed data sample and reconstructing the block of data samples based on the block of compressed data samples and the indicated type of compression applied to the plurality of data samples.

In some aspects, reconstructing each respective compressed data sample in the block of compressed data samples comprises applying a left shift to the respective data sample according to the number of trailing bits to add to each respective compressed data sample.

Example Processing System for Efficient Blockwise Vector Data Compression

Figure 5:
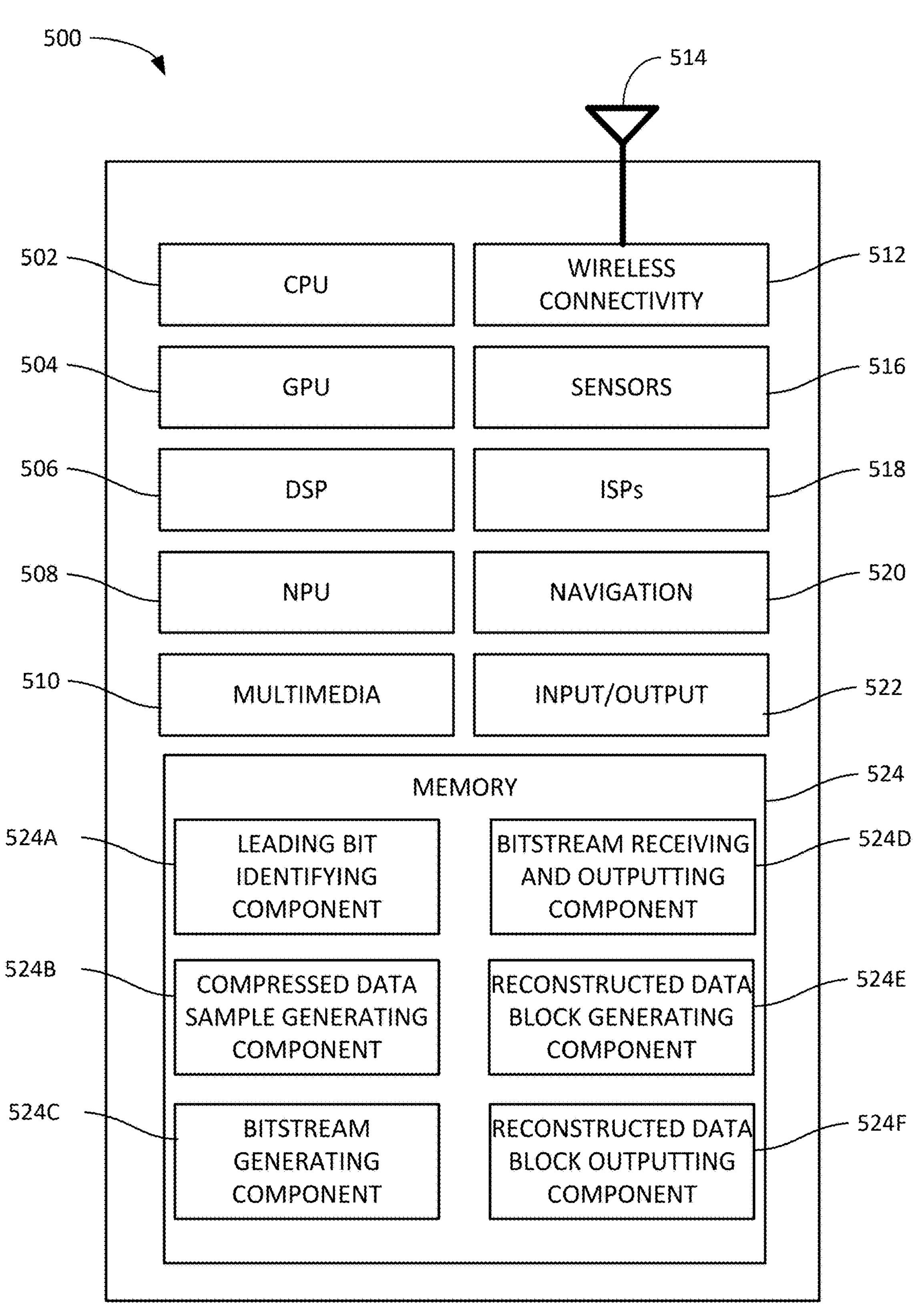
FIG. 5 depicts an example processing system configured to perform various aspects of the present disclosure.

FIG. 5 depicts an example processing system 500 configured to perform various aspects of the present disclosure, including, for example, the techniques and methods described with respect to FIGS. 1-4. Although depicted as a single system for conceptual clarity, in at least some aspects, as discussed above, the operations described below with respect to the processing system 500 may be distributed across any number of devices.

The processing system 500 includes a central processing unit (CPU) 502, which in some examples may be a multi-core CPU. Instructions executed at the CPU 502 may be loaded, for example, from a program memory associated with the CPU 502 or may be loaded from a partition of memory 524.

The processing system 500 also includes additional processing components tailored to specific functions, such as a graphics processing unit (GPU) 504, a digital signal processor (DSP) 506, a neural processing unit (NPU) 508, a multimedia processing unit 510, and a wireless connectivity component 512.

An NPU, such as NPU 508, is generally a specialized circuit configured for implementing control and arithmetic logic for executing machine learning algorithms, such as algorithms for processing artificial neural networks (ANNs), deep neural networks (DNNs), random forests (RFs), and the like. An NPU may sometimes alternatively be referred to as a neural signal processor (NSP), tensor processing unit (TPU), neural network processor (NNP), intelligence processing unit (IPU), vision processing unit (VPU), or graph processing unit.

NPUs, such as the NPU 508, are configured to accelerate the performance of common machine learning tasks, such as image classification, machine translation, object detection, and various other predictive models. In some examples, a plurality of NPUs may be instantiated on a single chip, such as a system-on-a-chip (SoC), while in other examples the NPUs may be part of a dedicated neural-network accelerator.

NPUs may be optimized for training or inference, or in some cases configured to balance performance between both. For NPUs that are capable of performing both training and inference, the two tasks may still generally be performed independently.

NPUs designed to accelerate training are generally configured to accelerate the optimization of new models, which is a highly compute-intensive operation that involves inputting an existing dataset (often labeled or tagged), iterating over the dataset, and then adjusting model parameters, such as weights and biases, in order to improve model performance. Generally, optimizing based on a wrong prediction involves propagating back through the layers of the model and determining gradients to reduce the prediction error.

NPUs designed to accelerate inference are generally configured to operate on complete models. Such NPUs may thus be configured to input a new piece of data and rapidly process this new data through an already trained model to generate a model output (e.g., an inference).

In some implementations, the NPU 508 is a part of one or more of the CPU 502, the GPU 504, and/or the DSP 506.

In some examples, the wireless connectivity component 512 may include subcomponents, for example, for third generation (3G) connectivity, fourth generation (4G) connectivity (e.g., 4G Long-Term Evolution (LTE)), fifth generation (5G) connectivity (e.g., New Radio (NR)), Wi-Fi connectivity, Bluetooth connectivity, and other wireless transmission standards. The wireless connectivity component 512 is further coupled to one or more antennas 514.

The processing system 500 may also include one or more sensor processing units 516 associated with any manner of sensor, one or more image signal processors (ISPs) 518 associated with any manner of image sensor, and/or a navigation component 520, which may include satellite-based positioning system components (e.g., GPS or GLONASS) as well as inertial positioning system components.

The processing system 500 may also include one or more input and/or output devices 522, such as screens, touch-sensitive surfaces (including touch-sensitive displays), physical buttons, speakers, microphones, and the like.

In some examples, one or more of the processors of the processing system 400 may be based on an ARM or RISC-V instruction set.

In some examples, one or more of the processors of the processing system 500 may include one or more arithmetic shifters, such as the arithmetic shifter 200 illustrated in FIG. 2, which can be used to efficiently compress data using arithmetic right shifts and addition of a carry bit to the right-shifted data.

The processing system 500 also includes the memory 524, which is representative of one or more static and/or dynamic memories, such as a dynamic random access memory, a flash-based static memory, and the like. In this example, the memory 524 includes computer-executable components, which may be executed by one or more of the aforementioned processors of the processing system 500.

In particular, in this example, the memory 524 includes a leading bit identifying component 524A, a compressed data sample generating component 524B, a bitstream generating component 524C, and a bitstream receiving and outputting component 524D, a reconstructed data block generating component 524E, and a reconstructed data block outputting component 524F. Though depicted as discrete components for conceptual clarity in FIG. 5, the illustrated components (and others not depicted) may be collectively or individually implemented in various aspects.

Generally, the processing system 500 and/or components thereof may be configured to perform the methods described herein.

Notably, in other aspects, aspects of the processing system 500 may be omitted, such as where the processing system 500 is a server computer or the like. For example, the multimedia processing unit 510, the wireless connectivity component 512, the sensor processing units 516, the ISPs 518, and/or the navigation component 520 may be omitted in other aspects. Further, aspects of the processing system 500 may be distributed between multiple devices.

EXAMPLE CLAUSES

Implementation details of various aspects of the present disclosure are described in the following numbered clauses:

Clause 1: A method for data compression, comprising: identifying, for a block of data samples, a number of leading bits to remove from each data sample in the block of data samples; generating a block of compressed data samples based on the identified number of leading bits and truncation of a number of least significant bits from each data sample in the block of data samples; generating a bitstream including the block of compressed data samples and an indication of a type of compression applied to the block of data samples; and outputting the generated bitstream.

Clause 2: The method of Clause 1, wherein the indication of the type of compression applied to the block of data samples comprises a first header indicating whether the bitstream includes compressed data and a second header indicating the number of leading bits removed from each data sample in the block of compressed data samples, the second header being located subsequent to the first header in the generated bitstream.

Clause 3: The method of Clause 2, wherein the second header comprises a single field indicating the number of leading bits removed from each data sample in the block of compressed data samples.

Clause 4: The method of Clause 3, further comprising: receiving the generated bitstream and, for each respective compressed data sample in the block of compressed data samples in the received bitstream: adding the number of leading bits as most significant bits to the respective compressed data sample; and adding the number of truncated least significant bits to the respective compressed data sample.

Clause 5: The method of Clause 1, wherein the indication of the type of compression applied to the block of data samples comprises a first header indicating whether the bitstream includes compressed data and a plurality of second headers, and wherein each second header of the plurality of second headers identifies the number of leading bits removed from each data sample in a corresponding block of compressed data samples.

Clause 6: The method of Claim 5, further comprising: receiving the generated bitstream; and for each respective compressed data sample in the block of compressed data samples: adding the number of leading bits identified in a corresponding second header as most significant bits to the respective compressed data sample; reconstructing the block of data samples based on the block of compressed data samples and the indicated type of compression applied to the plurality of data samples.

Clause 7: The method of any of Clauses 1 through 6, wherein generating the block of compressed data samples comprises, for each respective data sample in the block of data samples: applying a right shift to the respective data sample according to the number of least significant bits identified for truncation, wherein a most significant bit of the least significant bits identified for truncation is designated as a carry bit; and adding the carry bit to the right-shifted respective data sample.

Clause 8: A method for data decompression, comprising: receiving a bitstream including a block of compressed data samples and an indication of a type of compression applied to the block of compressed data samples; generating a reconstructed data block by reconstructing each respective compressed data sample in the block of compressed data samples based on the indicated type of compression applied to the block of compressed data samples, wherein reconstructing each respective compressed data sample comprises adding a number of leading bits and a number of trailing bits to each respective compressed data sample based on the indicated type of compression applied to the block of compressed data samples; and outputting the reconstructed data block.

Clause 9: The method of Clause 8, wherein the indication of the type of compression applied to the block of data samples comprises a first header indicating whether the bitstream includes compressed data and a second header indicating the number of leading bits removed from each data sample in the block of compressed data samples, the second header being located subsequent to the first header in the received bitstream.

Clause 10: The method of Clause 9, wherein the second header comprises a single field indicating the number of leading bits to add to each compressed data sample in the block of compressed data samples.

Clause 11: The method of Clause 10, wherein generating the reconstructed data block comprises, for each respective compressed data sample: adding the number of leading bits as most significant bits to the respective compressed data sample; and adding the number of trailing bits as least significant bits to the respective compressed data sample.

Clause 12: The method of any of Clauses 8 through 11, wherein the indication of the type of compression applied to the block of data samples comprises a first header indicating whether the bitstream includes compressed data and a plurality of second headers, and wherein each second header of the plurality of second headers identifies the number of leading bits removed from each data sample in a corresponding block of compressed data samples.

Clause 13: The method of Clause 12, wherein generating the reconstructed data block comprises, for each respective compressed data sample: adding the number of leading bits identified in a corresponding second header as most significant bits to the respective compressed data sample; and reconstructing the block of data samples based on the block of compressed data samples and the indicated type of compression applied to the plurality of data samples.

Clause 14: The method of any of Clauses 8 through 13, wherein reconstructing each respective compressed data sample in the block of compressed data samples comprises applying a left shift to the respective data sample according to the number of trailing bits to add to each respective compressed data sample.

Clause 15: An arithmetic shifter for compressing data, comprising: an arithmetic right shifter configured to shift a value in an input register by a number of bits; a multiplexer configured to output a carry bit from the number of bits based on a selector signal identifying that a compression operation is being executed; and an adder configured to add the shifted value generated by the arithmetic right shifter to an output of the multiplexer, wherein a data compression operation executed using the arithmetic shifter comprises an operation executable via invoking a single instruction on a processing system including the arithmetic shifter.

Clause 16: A processing system comprising: a memory comprising computer-executable instructions; and one or more processors configured to execute the computer-executable instructions and cause the processing system to perform a method in accordance with any of Clauses 1-14.

Clause 17: A processing system comprising means for performing a method in accordance with any of Clauses 1-14.

Clause 18: A non-transitory computer-readable medium comprising computer-executable instructions that, when executed by one or more processors of a processing system, cause the processing system to perform a method in accordance with any of Clauses 1-14.

Clause 19: A computer program product embodied on a computer-readable storage medium comprising code for performing a method in accordance with any of Clauses 1-14.

Additional Considerations

The preceding description is provided to enable any person skilled in the art to practice the various aspects described herein. The examples discussed herein are not limiting of the scope, applicability, or aspects set forth in the claims. Various modifications to these aspects will be readily apparent to those skilled in the art, and the generic principles defined herein may be applied to other aspects. For example, changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

As used herein, the word "exemplary" means "serving as an example, instance, or illustration." Any aspect described herein as "exemplary" is not necessarily to be construed as preferred or advantageous over other aspects.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The following claims are not intended to be limited to the aspects shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S. C. § 112(f) unless the element is expressly recited using the phrase "means for" or, in the case of a method claim, the element is recited using the phrase "step for." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. A method for data compression, comprising:

identifying, for a block of data samples, a number of leading bits to remove from each data sample in the block of data samples;

generating a block of compressed data samples based on the identified number of leading bits and truncation of a number of least significant bits from each data sample in the block of data samples;

generating a bitstream including the block of compressed data samples and an indication of a type of compression applied to the block of data samples; and outputting the generated bitstream.

2. The method of claim 1, wherein the indication of the type of compression applied to the block of data samples comprises a first header indicating whether the bitstream includes compressed data and a second header indicating the number of leading bits removed from each data sample in the block of compressed data samples, the second header being located subsequent to the first header in the generated bitstream.

3. The method of claim 2, wherein the second header comprises a single field indicating the number of leading bits removed from each data sample in the block of compressed data samples.

4. The method of claim 3, further comprising:

receiving the generated bitstream and, for each respective compressed data sample in the block of compressed data samples in the received bitstream:

adding the number of leading bits as most significant bits to the respective compressed data sample; and adding the number of truncated least significant bits to the respective compressed data sample.

5. The method of claim 1, wherein the indication of the type of compression applied to the block of data samples comprises a first header indicating whether the bitstream includes compressed data and a plurality of second headers, and wherein each second header of the plurality of second headers identifies the number of leading bits removed from each data sample in a corresponding block of compressed data samples.

6. The method of claim 5, further comprising:

receiving the generated bitstream; and for each respective compressed data sample in the block of compressed data samples:

adding the number of leading bits identified in a corresponding second header as most significant bits to the respective compressed data sample;

reconstructing the block of data samples based on the block of compressed data samples and the indicated type of compression applied to the plurality of data samples.

7. The method of claim 1, wherein generating the block of compressed data samples comprises, for each respective data sample in the block of data samples:

applying a right shift to the respective data sample according to the number of least significant bits identified for truncation, wherein a most significant bit of the least significant bits identified for truncation is designated as a carry bit; and adding the carry bit to the right-shifted respective data sample.

8. A method for data decompression, comprising:

receiving a bitstream including a block of compressed data samples and an indication of a type of compression applied to the block of compressed data samples;

generating a reconstructed data block by reconstructing each respective compressed data sample in the block of compressed data samples based on the indicated type of compression applied to the block of compressed data samples, wherein reconstructing each respective compressed data sample comprises adding a number of leading bits and a number of trailing bits to each respective compressed data sample based on the indicated type of compression applied to the block of compressed data samples; and outputting the reconstructed data block.

9. The method of claim 8, wherein the indication of the type of compression applied to the block of data samples comprises a first header indicating whether the bitstream includes compressed data and a second header indicating the number of leading bits removed from each data sample in the block of compressed data samples, the second header being located subsequent to the first header in the received bitstream.

10. The method of claim 9, wherein the second header comprises a single field indicating the number of leading bits to add to each compressed data sample in the block of compressed data samples.

11. The method of claim 10, wherein generating the reconstructed data block comprises, for each respective compressed data sample:

adding the number of leading bits as most significant bits to the respective compressed data sample; and adding the number of trailing bits as least significant bits to the respective compressed data sample.

12. The method of claim 8, wherein the indication of the type of compression applied to the block of data samples comprises a first header indicating whether the bitstream includes compressed data and a plurality of second headers, and wherein each second header of the plurality of second headers identifies the number of leading bits removed from each data sample in a corresponding block of compressed data samples.

13. The method of claim 12, wherein generating the reconstructed data block comprises, for each respective compressed data sample:

adding the number of leading bits identified in a corresponding second header as most significant bits to the respective compressed data sample; and reconstructing the block of data samples based on the block of compressed data samples and the indicated type of compression applied to the plurality of data samples.

14. The method of claim 8, wherein reconstructing each respective compressed data sample in the block of compressed data samples comprises applying a left shift to the respective data sample according to the number of trailing bits to add to each respective compressed data sample.

15. An arithmetic shifter for compressing data, comprising:

an arithmetic right shifter configured to shift a value in an input register by a number of bits;

a multiplexer configured to output a carry bit from the number of bits based on a selector signal identifying that a compression operation is being executed; and an adder configured to add the shifted value generated by the arithmetic right shifter to an output of the multiplexer, wherein a data compression operation executed using the arithmetic shifter comprises an operation executable via invoking a single instruction on a processing system including the arithmetic shifter.

* * * * *